US008709288B2

(12) United States Patent
Rouse et al.

(10) Patent No.: US 8,709,288 B2
(45) Date of Patent: Apr. 29, 2014

(54) HIGH CONDUCTIVE WATER-BASED SILVER INK

(75) Inventors: Jason Haden Rouse, Jersey City, NJ (US); Dave Klein, Wayne, NJ (US)

(73) Assignee: Sun Chemical Corporation, Parsippany, NJ (US)

( * ) Notice: Subject to any disclaimer, the term of this patent is extended or adjusted under 35 U.S.C. 154(b) by 275 days.

(21) Appl. No.: 11/530,359

(22) Filed: Sep. 8, 2006

(65) Prior Publication Data

US 2008/0182090 A1    Jul. 31, 2008

(51) Int. Cl.
*H01B 1/00* (2006.01)
*H01B 1/06* (2006.01)
*H01B 1/02* (2006.01)
*B41M 1/12* (2006.01)
*B41M 5/00* (2006.01)

(52) U.S. Cl.
USPC ........... 252/500; 252/512; 252/514; 101/129; 101/463.1

(58) Field of Classification Search
USPC ........... 428/208; 252/511, 500, 514; 101/129, 101/463.1
See application file for complete search history.

(56) References Cited

U.S. PATENT DOCUMENTS

| | | |
|---|---|---|
| 4,592,961 A | 6/1986 | Ehrreich |
| 5,286,415 A | 2/1994 | Buckley et al. |
| 5,389,403 A | 2/1995 | Buckley et al. |
| 5,492,653 A | 2/1996 | Hochheimer et al. |
| 5,622,547 A | 4/1997 | Maslowski et al. |
| 5,653,918 A | 8/1997 | Towlson |
| 5,658,499 A | 8/1997 | Steinberg et al. |
| 5,696,196 A | 12/1997 | DiLeo |
| 5,756,008 A | 5/1998 | Slutsky et al. |
| 5,855,820 A | 1/1999 | Chan et al. |
| 6,190,846 B1 * | 2/2001 | Majumdar et al. ............ 430/529 |
| 6,410,637 B1 | 6/2002 | Odell et al. |
| 6,576,336 B1 | 6/2003 | LeGrande |
| 6,866,799 B2 * | 3/2005 | Orsbon et al. ................ 252/511 |
| 6,939,484 B2 | 9/2005 | Dorfman |
| 2003/0151028 A1 * | 8/2003 | Lawrence et al. ............ 252/500 |
| 2003/0209697 A1 * | 11/2003 | Orsbon et al. ................ 252/500 |
| 2004/0144958 A1 | 7/2004 | Conaghan et al. |
| 2005/0040934 A1 * | 2/2005 | Shanton ...................... 340/5.92 |

FOREIGN PATENT DOCUMENTS

| | | |
|---|---|---|
| DE | 100 10 538 A1 | 9/2001 |
| EP | 0 230 303 A2 | 7/1987 |
| EP | 0 230 303 A3 | 7/1987 |
| EP | 1 271 671 A1 | 1/2003 |
| JP | 06-080915 * | 3/1994 |
| WO | WO03/078531 * | 9/2003 |
| WO | WO-03/078531 A1 | 9/2003 |
| WO | WO-2005/056702 A1 | 6/2005 |
| WO | WO2006/130980 | 12/2006 |

* cited by examiner

*Primary Examiner* — Monique Peets

(57) ABSTRACT

Disclosed is a conductive composition which can be used to form an aqueous conductive ink with increased conductivity. The aqueous conductive composition contains conductive particles, preferably silver, an anionic wetting agent and a styrene-acrylic copolymer. The composition is highly conductive and requires reduced drying energy. In addition, it may be applied to low cost substrates by high speed printing processes.

39 Claims, No Drawings

HIGH CONDUCTIVE WATER-BASED SILVER INK

FIELD OF INVENTION

The present invention relates generally to electrically conductive aqueous coating compositions having improved properties. The dried coating has use in various electronic, shielding, and radio frequency identification (RFID) applications. The compositions are particularly useful as inks for high speed printing to produce electronic circuitry such as RFID antennas et. al.

BACKGROUND OF THE INVENTION

Electrically conductive coatings are much in demand by the electronics industry. They are used to protect business equipment from electronic interference (EMI/RFI shielding) to forming complex electronic circuitry on printed circuit boards to antennas for radio frequency identification in applications ranging from warehouse storage of merchandise to U.S. Passports. Electrically conductive printings inks, among the various conductive coatings extant, are growing in demand and, in terms of the variety of application methods and compositions needed to meet the application demands, constitute the paradigm of that coatings class.

Thus, electrically conductive inks are used by the printed electronics industry in order to form conductive elements such as RFID antennas or lines on printed circuit boards. Conductive inks in use today consist essentially of an organic polymer matrix containing, dispersed therein, metal powders, metal powder precursors (metallic decomposition compounds), metal coated fine particles or other conductive particles such as graphite powder. The inks may also contain, usually in low concentration, additives whose role is to maintain/improve stability (for instance, setting agents) or control flow to allow easy application (for instance, solvents), etc. The key property of conductivity is adjusted by controlling the concentration of the metallic powders, its value being proportional, albeit not linearly, to the metal/carrier ratio. Conductive ink compositions are usually applied to a substrate using either low speed processes (e.g., screen printing) or high speed processes (e.g., rotary screen, flexography, gravure), the latter offering the advantage of lower processing cost per print.

The majority of conductive ink compositions in use today are solvent-based thick film systems designed for low speed screen printing (See, e.g., U.S. Pat. Nos. 6,322,620, 4,592, 961, 5,622,547, 5,653,918, and 6,939,484. One popular method for printing RFID antennas and the like is screen printing silver-based inks on plastic, paper or cardboard substrates, and then heating to drive off solvent and cure or anneal the ink to thereby form conductive lines with a thickness over 10 micrometers. However, such compositions have many drawbacks. In addition to environmental issues associated with solvent-based systems, thick film applications require considerable thermal energy for drying. They frequently require high drying and curing temperatures and relatively long drying and curing times. Moreover, such a process requires the substrate to be highly heat stable to permit removal of the solvent and curing/annealing of the ink. Therefore, paper, cardboard substrates, and low glass transition (Tg) temperature polymeric substrates, are not easily adaptable as substrates because they cannot withstand high temperatures, even though they may be cost-effective. Other conductive ink systems that can be printed using high speed processes (e.g., gravure) also require high temperature curing conditions (typically over 150° C.). See, e.g., US Pat. Pub. No. 2004/0144958 A1.

Aqueous conductive inks and coatings offer significant ecological advantages over solvent-based compositions, as the latter release solvents into the atmosphere on drying. Aqueous conductive inks, however, have hitherto not offered the high conductivity, or low electrical resistivity, achievable with solvent-based formulas. See, e.g., U.S. Pat. Nos. 5,286, 415, 5,389,403, 5,492,653, 5,658,499, 5,756,008, 5,855,820, 6,410,637, 6,576,336, and 6,866,799. High conductivity is necessary to insure that the ink will carry a sufficient electric current when cured. While higher conductivity is conventionally achieved by increasing the concentration of the conductive powder (typically silver), this approach often entails performance as well as economic penalties such as decreased shelf-life and increased cost.

Other desired properties of conductive inks include good abrasion and chemical resistance when dried/cured/annealed so that they are not easily scratched or wiped off during subsequent uses. Therefore, the conductive ink should acceptably adhere to the substrate when dried/cured/annealed and resist being wiped off by a solvent. Furthermore, for high-speed printing (e.g. rotary screen, flexography, gravure), it is necessary that the conductive ink have proper rheology and substrate wetting properties to obtain good ink transfer and graphic reproduction. Additionally, the ink should possess good flexibility and thermal stability to withstand the physical deformation to which the substrate may be subjected.

Accordingly, there is a need for an aqueous conductive ink with high conductivity, good printability, short drying and curing times at low drying and curing temperatures for use with high speed printing processes (e.g., rotary screen, flexography, gravure). Conductive inks with other desired properties would be further advantageous. The present invention provides a family of electrically conductive compositions suitable for use as coatings and especially as high-speed inks, which possess the desirable properties/characteristics.

SUMMARY OF THE INVENTION

While conventional wisdom dictates that maximizing the number of conductive particles in a composition produces the highest level of conductivity. It has now been found that in conductive compositions whose matrix is a water soluble acrylic copolymer capable of dispersing conductive particles, the addition of an anionic wetting agent also substantially increases the conductivity of printed lines and/or graphics. For instance, printing electrically conductive graphics with line spacing of less than about 500 micrometer (particularly less than about 300 micrometer) and with less than 140 milohm/sq sheet resistance can be realized.

This invention more specifically relates to an aqueous conductive composition such as an ink suitable for use in RFID and other electronic technologies. The composition is highly conductive and requires reduced drying energy. In addition, it may be applied to low cost substrates via high speed printing processes. The conductive composition of this invention comprises: (meth)acrylic copolymer or salt thereof; conductive particles; an anionic surface wetting agent; defoamer; water and optionally other solvents.

Four primary frequency ranges for RFID applications are low frequency (LF) (100 to 140 kHz), high frequency (HF) (~13.56 MHz), ultra-high frequency (UHF) (800 to 1000 MHz) and microwave (~2.45 GHz). The invention is useful in connection with RFID antennas, particularly those operating in the UHF spectrum. Importantly, due to recent mandates from the US military and large retailers for RFID labeling of items, UHF antennas are normally used in conjunction with RFID integrated circuit chips that are compliant with the EPCGlobal developed Class 1/Gen 2 protocol standard. The Gen 2 standard allows the data contained within the chip to be read multiple times over the broad frequency range that encompasses North America, Japan, and European standards.

RFID integrated circuit chips are normally attached to the antenna either by directly attaching the chip to the antenna using adhesive (conductive or non-conductive) or by attaching to the antenna a strap which contains the chip pre-mounted onto two conductive pads (normally in conjunction with a conductive adhesive). Companies selling UHF chips are Impinj, Texas Instrument, STM Micro, Philips Electronics while Alien Technology and Texas Instrument provide straps. A different technology to produce EPC Gen 2 compliant antennas has been developed by Tagsys RFID. The Tagsys RFID AK Kernel system utilizes an EPC Class 1/Gen 2 UHF compliant chip mounted onto a small (12 mm by 8 mm) primary antenna. The AK Kernal module is then applied either on top of or near to a larger secondary antenna using normally a non-conductive adhesive so that no direct electrical contact exists between the primary and secondary antennas. The function of the secondary antenna is to absorb the UHF energy and transmit it to the "Kernel module."

These and other aspects will become apparent upon reading the following detailed description of the invention.

DETAILED DESCRIPTION OF THE INVENTION

The present invention provides an aqueous conductive composition suitable for use as a high speed printing ink with desirable properties, particularly high conductivity, printability on low cost substrates (e.g., cellulosic and low Tg plastics) and having low thermal energy requirements for drying and curing/annealing. It has been discovered that anionic wetting agents in combination with styrene-acrylic copolymers capable of dispersing silver particles is synergistic, providing a substantial increase in the conductivity of printed lines and/or graphics. In addition, the combination of the anionic wetting agent with the styrene-acrylic copolymer produces a conductive ink which gives excellent graphic reproduction, uniform lay-down, shelf-stability, proper rheology, and substrate adhesion. Importantly, the ink provides distinct environmental advantages since it is water-based.

The resulting conductive ink composition may be applied to substrates by a variety of techniques such as gravure printing, screen printing, offset printing, lithographic printing, letterpress printing, spraying, brushing (painting), or curtain coating. The preferred printing method of application is high speed printing such as rotary screen, flexography, and gravure. High speed printability is important in order to reduce the production costs of electrical circuitry and antennas. However, due to the intricate circuitry patterns often demanded by the electronics industry in high performance applications such as, for example, in the preparation of touch pad circuitry and direct-chip pads used in RFID antenna, it is also important that print resolution be maintained during such high-speed printing.

The unique properties of the inventive composition provide applicability in numerous applications. In addition to the use in RFID antenna construction, the composition can also be used to construct various antenna structures used in both active and passive applications. Formation of printed circuitry using the composition allows uses in items such as touch pads, electronic toys, displays, flexibly wiring, etc. Items containing such printed circuits include computers, monitors, televisions, and automated machinery that are used in various industries ranging from electronics to automotive to industrial settings.

A composition according to the present invention contains:
(a) conductive particles;
(b) an anionic wetting agent;
(c) styrene/(meth)acrylic copolymer or salt thereof and blends thereof with other (meth)acrylic copolymer resins or salts;
(d) defoamer; and
(e) water.

The preferred conductive particle in the present invention is silver. Preferably, the silver is present as flakes and the flakes have a longest dimension (D90) of about 100 nm to 50 microns, more preferably between 1 to 20 microns. The dimensions of particles, typically silver flake, is normally determined using light scattering of the particles dispersed in a solvent. Alternatively, the silver may be in the form of spherical particles, granular particles, fibers, grains, or platelets. The particles may be surface treated with at least one straight-chain carboxylic acid or salt of the acid.

However, other conductive metal particles may also be used in the composition of this invention, such as copper, gold, nickel, silver alloys, silver plated metals such as silver coated copper and silver coated nickel, silver coated glass, silver coated mica, silver coated graphite, nickel coated carbon, nickel coated graphite, and other conductive particles known in the field. Alternatively, carbon, typically in the form of carbon black or graphite may also be used, along or in combination with the metal particles.

Any known anionic surfactant, or combination of anionic surfactants, can be employed in the present invention. Non-limiting examples of the surfactants useful include the conventional $C_{11-18}$ alkylbenzene sulphonates, the $C_{10-18}$ secondary (2,3) alkyl sulphates of the formula $CH_3(CH_2)_x(CHOSO_3\text{-}M^+)CH_3$ and $CH_3(CH_2)_y(CHOSO_3\text{-}M^+)CH_2CH_3$ where x and (y+1) are integers of at least about 7, preferably at least about 9, and M is a water-solubilising cation, especially sodium, unsaturated sulphates such as oleyl sulphate, $C_{10-18}$ alkyl alkoxy carboxylates (especially the $EO_{1-7}$ ethoxycarboxylates), the $_{10-18}$ glycerol ethers, the $C_{10-18}$ alkyl polyglycosides and their corresponding sulphated polyglycosides, and $C_{12-18}$ alpha-sulphonated fatty acid esters.

Other anionic surfactants include salts (including, for example, sodium, potassium, ammonium, and substituted ammonium salts such a mono-, di- and triethanolamine salts) of soap, $C_{9-20}$ linear alkylbenzenesulphonates, $C_{8-22}$ primary or secondary alkanesulphonates, $C_{8-24}$ olefinsulphonates, sulphonated polycarboxylic acids, alkyl glycerol sulphonates, fatty acyl glycerol sulphonates, fatty oleyl glycerol sulphates, alkyl phenol ethylene oxide ether sulphates, paraffin sulphonates, alkyl phosphates, isothionates such as the acyl isothionates, N-acyl taurates, fatty acid amides of methyl tauride, alkyl succinamates and sulphosuccinates, monoesters of sulphosuccinate (especially saturated and unsaturated $C_{12-18}$ monoesters) diesters of sulphosuccinate (especially saturated and unsaturated $C_{6-14}$ diesters), N-acyl sarcosinates, sulphates of alkylpolysaccharides such as the sulphates of alkylpolyglucoside, branched primary alkyl sulphates, alkyl polyethoxy carboxylates such as those of the formula $RO(CH_2CH_2O)_kCH_2COO^-M^+$ wherein R is a $C_{8-22}$ alkyl, k is an integer from 0 to 10, and M is a soluble salt-forming cation, and fatty acids esterified with isethionic acid and neutralized with sodium hydroxide.

Specific examples of anionic wetting agents include dihexyl sulphosuccinate salt, di-2-ethylhexyl sulfosuccinate salt, dioctyl sulfosuccinate salt, and ionic polyacrylate copolymers used as surface wetting/leveling agents.

Any know styrene-(meth)acrylic copolymer, or combination of copolymers, can be employed in accordance with this invention. The styrene copolymers are prepared by reacting styrene or a substituted styrene with either an acrylate or methacrylate. Frequently, the styrene copolymers are prepared by reacting styrene with a hydroxyalkyl acrylate. Such hydroxyalkyl acrylates have a hydroxy content ranging up to about 25%, e.g., from about 2 to 12% by weight, and include acrylates wherein the alkyl group has from 1 to 12 aliphatic carbon atoms. The hydroxyalkyl acrylates include not only the mono- and polyacrylates or mono- and polymethylates such as the mono- or polyhydroxy alkyl di- and triacrylates or alkacrylates, e.g. the methacrylates and ethacrylates, but also the halogen-substituted acrylates such as the chlorine or bromine substituted mono- or polyhydroxy alkyl acrylates, e.g., the mono- or polyhydroxy alkyl chloroacrylates or hydroxychloroalkyl diacrylates or dialkacrylates. These (meth)acrylates may be described as esters of acrylic or substituted-acrylic acid including, for example, 2-hydroxypropyl acrylate, 3-hydroxybutyl acrylate, 4-hydroxypentyl acrylate, 5-hydroxypentyl acrylate, 5-hydroxyhexyl acrylate, 2-hydroxybutyl acrylate, 2-hydroxyethyl methacrylate, 2-hydroxyethyl chloroacrylate, 2-hydroxyethyl acrylate, 2-hydroxyethyl ethacrylate, hydroxybutyl ethacrylate, 3-hydroxypropyl methacrylate, 3-hydroxypropyl chloroacrylate, 3-hydroxybutyl acrylate, 4-hydroxybutyl methacrylate, 3-hydroxybutyl ethacrylate, 3-hydroxypropyl ethacrylate, 3-hydroxybutyl chloroacrylate, 3-hydroxypropyl acrylate, 3-hydroxypropyl 2-chloroacrylate, 4-hydroxybutyl acrylate, 3-hydroxyethyl 2-chloroacrylate, 3-hydroxybutyl chloromethacrylate, 5-hydroxypentyl acrylate, 2-hydroxypropyl chloromethacrylate, 5-hydroxypentyl methacrylate, 6-hydroxyhexyl acrylate, 2-hydroxybutyl chloromethacrylate, 2-hydroxyethyl chloroethacrylate, 3-hydroxybutyl methacrylate, 2-hydroxyethyl chloromethacrylate, 2-hydroxypropyl chloroethacrylate, 2-hydroxybutyl dichloroethacrylate, 2-hydroxybutyl chloromethacrylate, 3-hydroxypropyl chloromethacrylate, 3-hydroxypropyl chloroethacrylate, 3-hydroxyhexyl chloromethacrylate, 3-hydroxypentyl 2-chloroacrylate, 3-hydroxybutyl bromomethacrylate, 2-hydroxybutyl chloromethacrylate, 4-hydroxybutyl 2-chloroacrylate, 3-hydroxypentyl 2-chloroethacrylate, 3-hydroxypropyl 2-bromoethacrylate, 4-hydroxybutyl 2-bromoethacrylate, 5-hydroxyhexyl methacrylate, 6-hydroxypentyl chloromethacrylate and various other vinyl or acrylic esters containing at least one free alcoholic hydroxyl group, e.g., a mono- or polyhydroxy alkyl ester of acrylic, methacrylic or ethacrylic acid.

Other acrylic esters that may be used have one or more free hydroxyl groups and include polyethylene glycol methacrylate, diethylene glycol methacrylate, triethylene glycol methacrylate, tetraethylene glycol methacrylate, dipropylene glycol methacrylate, tetraethylene glycol chloroacrylate, tetraethylene glycol acrylate, tetraethylene glycol dichloroacrylate, glycerol methacrylate, pentaerythritol methacrylate, diethylene glycol monoacrylate, triethylene glycol monoacrylate, dipropylene glycol monoacrylate, trimethylol ethane diacrylate, trimethylol propane diacrylate, pentaerythritol triacrylate, glycerol acrylate, pentaerythritol monoacrylate, trimethylol ethane monoacrylate, trimethylol propane monoacrylate, trimethylol ethane chloroacrylate, trimethylol propane methacrylate, trimethylol butane methacrylate, tetramethylene glycol chloroacrylate, triethylene glycol methacrylate, tetraethylene glycol acrylate, pentaerythritol dichloroacrylate, dipentaerythritol diacrylate, dipentaerythritol triacrylate pentaerythritol dimethacrylate, pentaerythritol methacrylate and combinations of any of these hydroxy-containing acrylates in various proportions.

Examples of commercially available styrene-acrylic copolymers that can be used in this invention included Jonceryl 100, Jonceryl 50, Jonceryl 682, Joncryl 60, Jonceryl 678, Jonceryl 85, (all from Jphnson Polymers), TruDot IJ-4680, Jonrez 1-2620, Hyatop HS-2734, Hyatop 2720 (all from MeadWestvaco) and blends thereof.

In addition to the foregoing resins, other acrylic resins can also be used in combination with the styrene-acrylic copolymers to add film flexibility. Examples of commercially available acrylic copolymer that can be used in this invention include Jonceryl 142, Jonceryl 91, Jonceryl 85 (all from Johnson Polymers), Morcryl 132 (from Rohm & Haas), Jonrez D-2153 (from MeadWestvaco), as well as blends thereof.

The copolymer(s) is preferably used in the form of a salt which provides or increases water solubility. Suitable salts can be formed with ammonia, amines, alcohols such as methanol, alkali metals such as sodium and potassium, and the like. It is most convenient to use the acrylic copolymers in the form of aqueous resin solutions.

One or more defoamers are employed to avoid obstructive foaming during mixing to prepare the composition and during the printing process. Any known conventional defoamer can be employed. Typical non-limiting examples include Surfynol® DF-659, Surfynol® DF-58, Surfynol® DF-66 (all from Air Products), Foammaster® (from Henkel) BYK®-019, BYK®-021, BYK®-022, BYK®-025 (all from Byk Chemie), and Dee Fo 215, Dee Fo XRM-1547A (all from Ultra Additives).

If desired, solvents such as alcohols, amines, glycols, acetates, ethers, ketones, aldehydes, amides, and blends thereof can be added to control or modify such things as rheology, drying speed, shelf stability as required.

The combination of the present invention generally contains about 10 to 90% conductive particles, preferably about 40 to 75% and most preferably about 50 to 70; about 0.01 to 6% anionic wetting agent, preferably about 0.1 to 3% and most preferably about 0.5 to 2%; about 2 to 50% styrene/(meth)acrylic copolymer, preferably about 2 to 20% and most preferably about 4 to 10%; about 0.01 to 4% defoamer, preferably about 0.1 to 2% and most preferably about 0.2 to 1.5%; and about 10 to 80% water, preferably about 20 to 65%, and most preferably about 25 to 35%; with the balance being other ingredients such as those described above. The copolymer to water ratio is preferably about 4 to 1 to 1 to 8. The composition may also be provided as a concentrate to be combined with the other ingredients. In that case, the conductive particles may be present in an amount of about 20 to 95% by weight, preferably about 40 to 80%, and more preferably about 60 to 70%; the styrene-acrylic copolymer about 5 to 50% by weight, preferably about 6 to 45% and most preferably about 7.5 to 30%; about 0.05 to 5% defoamer, preferably about 0.2 to 3% and most preferably about 0.3 to 2%; and the anionic surfactant is about 0.01 to 5% by weight, preferably about 0.1 to 3%, and more preferably about 0.1 to 1.5%. The concentrate may also contain other of the ink ingredients. Other conventional components may be present in the conductive composition. These include viscosity modifiers, drying retarding agents, flow additives, adhesion promoters and rheology modifies. These, and other additives, may be used singularly or in various combinations with each other.

The composition can be prepared using a number of methods. The preferred method of producing the composition is to add the various components to a container and mix the components via a high speed mixer to form the finished composition. Alternatively, the conductive particles (i.e. silver flake) can be dispersed into the acrylic copolymer via high speed mixing, ball milling, 3-roll milling, extrusion, etc. to form in some cases a concentrate to which the anionic wetting agent, defoamer, water and other solvents can be added to make the finished composition.

Methods of applying the composition to a substrate to form a conductive layer include coating, spraying, printing, and painting. Printing techniques applicable to this composition include letterpress, screen, rotary screen, gravure, and flexographic printing. The composition can be applied to various types of cellulosic substrates (i.e. paper, cardboard) and plastics such as polyesters, polypropylenes, etc.

The composition once applied to the substrate can be dried using a number of techniques and methods known in the field. For items prepared using a printing technique, the press can be equipped with IR dryers, forced hot air blowers, annealing rollers, or microwave units to remove the water solvent and cure/anneal the ink layer. Alternatively, the printed item could be partially dried on press and then either placed in a drying oven or routed through another drying system to further cure/anneal the ink.

In order to further illustrate the invention, various examples are set forth below, but the particular materials and amounts described in these examples, as well as other conditions and details, are not intended to limit this invention. All parts and percentages are by weight and all temperatures are in degrees Centigrade unless otherwise noted.

Example 1

In order to demonstrate the synergistic effect of adding anionic surface wetting agents to a styrene-acrylic copolymer on the conductivity of the printed layer, 16 wetting agents with various chemistries were added to a water based flexographic conductive ink formulation containing 63% silver flake (Ferro Corp)., 26% styrene-acrylic copolymer resin (27 wt % resin, ammonium salt, MeadWestvaco), 1% defoamer (Ultra Additives), and 10% water by weight. The amount of the wetting agent added to the base composition was 1.0-1.2% in all cases. The resulting ink was applied to a PET sheet using a 95Q flexographic handproofer, dried, and the sheet resistance measured. A Loresto-EP low resistivity meter with an ASP 4-point probe was used to measure the sheet resistance of 2 by 4 inch samples cut from the handproofs. The results are shown in Table 1.

TABLE 1

| Wetting Agent | Functional Type | Conductivity (sheet resistance) (ohms/square) |
|---|---|---|
| None | NA | 0.21 |
| BYK 381 (polyacrylate copolymer) | Anionic | 0.13 |
| Hydropalat 875 (di-2-ethylhexyl sulfosuccinate, Na salt) | Anionic | 0.15 |
| Hydropalat 680 (dihexyl sulfosuccinate, Na salt) | Anionic | 0.18 |
| BYK 333 (polyether modified polydimethyl siloxane) | Non-ionic | 0.20 |
| BYK 345 (polyether modified polydimethyl siloxane) | non-ionic | 0.20 |
| EDAPLAN LA 411 (modified siloxane-glycol copolymer) | Non-ionic | 0.25 |

TABLE 1-continued

| Wetting Agent | Functional Type | Conductivity (sheet resistance) (ohms/square) |
|---|---|---|
| BYK 348 (polyether modified polydimethyl siloxane) | Non-ionic | 0.26 |
| Surfynol 104PA (acetylenic diol) | Non-ionic | 0.22 |
| Surfynol 2502 (alkoxylated acetylenic diol) | Non-ionic | 0.27 |
| Surfynol SE-F (ethoxylated acetylenic diols) | Non-ionic | 0.26 |
| Surfynol 440 (ethoxylated acetylenic diol) | Non-ionic | 0.25 |
| Surfynol 420 ethoxylated acetylenic diols | Non-ionic | 0.27 |
| Metolat FC 388 (blend of polyglycolesters; diol ester) | Non-ionic | 0.32 |
| BYK 380N (polyacrylate) | Nonionic | 0.21 |
| Starfactant 20 (organic polymer) | Non-ionic | 0.22 |

As can be observed, only the use of anionic wetting agents results in a significant improvement in conductivity. Use of the other wetting agents provided no significant improvement in conductivity or even resulted in a decrease in performance (i.e., higher resistivity).

Example 2

To further illustrate that adding anionic wetting agents to styrene-acrylic copolymers results in a decrease in surface resistivity of the printed ink, the anionic wetting agents BYK 381 and Hydropalat 875 were added to a styrene-acrylic copolymer from Johnson Polymer. As in Example 1, a base composition comprising resin, silver flake, defoamer, and water was prepared and the anionic wetting agent added to this composition. The composition of the ink base is presented in Table 2. The base was prepared by mixing the following components at 6,000 rpm for 10 minutes with a Dispermat mixer.

TABLE 2

| Ingredient | Parts |
|---|---|
| Styrene-acrylic copolymer (Johnson Polymer) | 20.1 |
| Silver flake (Ferro Corp.) | 65.0 |
| Defoaming agent (Ultra Additives) | 0.24 |
| Water | 14.66 |

To the base composition in Table 2, 1 weight % BYK 381 was added. The composition was then applied to a PET substrate using a 95Q handproofer and dried, and sheet resistance measured. Compared to a sheet resistance of 1.22 ohm/sq obtained on the base composition without wetting agent, the composition containing BYK 381 had a sheet resistance of 0.38 ohm/sq. When 2 wt % Hydropalat 875 was added to the same base composition, the sheet resistance of the dried film was 0.83 ohm/sq. These results further demonstrate the synergistic effect that adding anionic wetting agents to styrene-acrylic resin/silver particles coatings on the conductivity of the dried film.

Example 3

The following example further illustrates typical properties of the inks of the present invention. A water based silver conductive ink was prepared by mixing the following components at 6,000 rpm for 10 minutes with a Dispermat mixer.

TABLE 3

| Ingredient | Parts |
|---|---|
| Styrene-acrylic copolymer (MeadWestvaco) | 25.9 |
| Anionic wetting agent (BYK-381) | 1.25 |
| Silver flake (Ferro Corp.) | 62.6 |
| Defoaming agent (Ultra Additives) | 0.25 |
| Water | 10 |
| Viscosity (Zahn cup #3@ 25° C.) | 30-35 seconds |

The ink was applied to a PET substrate and to a paper substrate and gave sheet resistance values of 0.12 and 0.10 ohms/sq after drying for a layer thickness of 3 to 5 microns (i.e. a volume resistivity between 30 and 60 microohms·cm).

The same ink but formulated without the anionic wetting agent exhibited a viscosity of 24-26 seconds, and sheet resistance values above 0.25 ohms/sq after drying (i.e. a volume resistivity above 125 microohms·cm).

Example 4

In order to demonstrate the suitability of the composition for printing RFID antennas, an UHF RFID antenna configuration (Alien "I") was printed using a flexographic press on a 60 lb coated paper substrate using the ink of Example 3. The resulting antennae were connected to Class 1/Generation 1 UHF RFID straps (chip attached to two conductive pads) from Alien Technologies with a 2-component silver epoxy conductive adhesive. Using a Alien ALR9800 reader, the resulting UHF RFID tags were detectable at a range exceeding 3 meters. Additionally, EPC compliant Class 1/Gen 2 UHF RFID straps from Alien Technologies were also attached to the printed "I" antenna and the resulting antennae could be read at a distance of over 2 meters and with read rates of about 600 per second at shorter distances.

Example 5

To further illustrate the high-speed and high-resolution capabilities of the inventive composition for printing electronic circuitry, the composition in Example 3 was printed at 150 FPM on a flexographic press using flexographic plates containing a rectangular graphic for sheet resistance measurements and the "Thin Propeller" UHF RFID antenna design from Impinj, Inc. The "Thin Propeller" is designed for direct-chip attachment and therefore contains contact pads that are only separated by 300 microns. On 60 lb coated paper the direct-chip attachment pads we successfully printed with any shorting of the circuits via pad-to-pad contacts. The sheet resistance measured under these print conditions was 0.12 ohm/sq. An Impinj Monza EPC compliant Class 1/Gen 2 UHF RFID integrated circuit chip was attached to the printed "Thin Propellor" antenna at the direct chip attachment points using an epoxy adhesive. The resulting antenna was read at a distance of about 2 meters using an Alien ALR9800 reader.

Example 6

To further demonstrate the suitability of the composition for printing RFID antennas that do not require a direct connection between the conductive antenna and the RFID integrated circuit chip, experiments were conducted using the AK Kerne system from Tagsys RFID. Using antenna designs similar to that found in FIGS. 5 (a fashion price tag) and 6 (a box) of the AK Tag Warm-Up Kit Revision 1.0 (February 2006) antennas were printed on a flexographic press using the ink in Example 3 on both PET (Melinex 359) and 60 lb coated paper. AK Kernel attached to the antenna designs similar to that in FIG. 5 printed on both PET and coated paper were read at about 1 meter and similar to FIG. 6 were read at about 3 meters using an Alien ALR9800 reader.

Example 7

To further illustrate the applicability of the inventive composition to be applied by other techniques the composition in Table 4 was prepared by mixing at 2000 RPM for 20 mins on a Dispermat mixer.

TABLE 4

| Ingredient | Parts |
|---|---|
| Styrene-acrylic copolymer (MeadWestvaco) | 25.4 |
| Anionic wetting agent (BYK-381) | 1.2 |
| Silver flake (Ferro Corp.) | 61.4 |
| Defoaming agent (Ultra Additives) | 1.0 |
| Water | 6.0 |
| N-butyl carbitol | 5.0 |

The composition of Table 4 was flat-bed screen printed using a 77T screen onto Melinex ST505 PET substrate then dried at 120 C for 5 minutes. The dried ink layer was about 7 microns in thickness and produced a sheet resistance of 0.080 ohms/sq (22 milliohm/sq at 25 microns thickness). Therefore, the prints produced in this example could be used in various electronic applications such as circuitry in printed circuit boards or HF/UHF RFID antennas, for example.

Example 8

To further illustrate that the inventive composition is applicable to coatings containing non-silver flake particles, a composition containing silver-coated glass flakes in a styrene-acrylic matrix was tested. The composition tested contained 44.9% silver-coated glass flake (Potters Industries), 37.7% styrene-acrylic copolymer resin (27 wt % resin, ammonium salt, MeadWestvaco), 0.2% defoamer (Ultra Additives), and 16.5% water by weight and was prepared by mixing at 2000 RPM for 20 min on a Dispermat mixer. To this composition 3.0 wt % of wetting agents of various chemistries was added (Table 5).

TABLE 5

| Wetting Agent | Functional Type | Conductivity (sheet resistance) (ohms/square) |
|---|---|---|
| None | NA | 4.78 |
| Metolat 285 (dioctyl sulfosuccinate, Na salt) | Anionic | 1.29 |
| Hydropalat 875 (di-2-ethylhexyl sulfosuccinate, Na salt) | Anionic | 1.39 |
| BYK 348 (polyether modified polydimethyl siloxane) | Non-ionic | 200 |
| Surfynol 420 | Non-ionic | 8944 |

TABLE 5-continued

| Wetting Agent | Functional Type | Conductivity (sheet resistance) (ohms/square) |
|---|---|---|
| (ethoxylated acetylenic diols) | | |
| Metolat FC 388 (blend of polyglycolesters; diol ester) | Non-ionic | 3.20 |
| BYK 380N (polyacrylate) | Nonionic | 3.91 |
| Starfactant 20 (organic polymer) | non-ionic | 2.11 |

The resulting ink was applied to a PET sheet using a 95Q flexographic handproofer, dried, and the sheet resistance measured. As can be observed, the anionic wetting agents resulted in the most significant improvement in conductivity. The other wetting agents showed either minor improvement in conductivity or resulted in a decrease in performance (i.e., higher resistivity).

While the invention has been described above with reference to specific embodiments thereof, it is apparent that many changes, modifications and variations can be made without departing from the spirit and scope thereof. Accordingly, it is intended to embrace all such changes, modifications and variations that fall within the spirit and broad scope of the foregoing description.

What is claimed is:

1. A method of forming a conductive pattern on a substrate comprising applying a conductive composition comprising (a) metallic silver conductive particles, (b) water soluble styrene/(meth)acrylic copolymer, (c) an anionic wetting agent, (d) defoamer and (e) 10 to 80% water, the composition providing a sheet resistance of less than 0.83 ohms/sq, on the substrate and drying the composition.

2. The method of claim 1, wherein the longest dimension of said silver conductive particles is from about 100 nm to 50 micrometers.

3. The method of claim 2, wherein said longest dimension of said silver conductive particles is from about 1 to 20 micrometers.

4. The method of claim 1, wherein said styrene/(meth)acrylic copolymer is a copolymer of styrene and an alkyl (meth)acrylate, optionally partly hydrolyzed or salified.

5. The method of claim 1, wherein said copolymer to water has a ratio of about 4 to 1 to 1 to 8.

6. The method of claim 1, wherein said styrene/(meth)acrylic copolymer comprises a blend with an alkyl (meth)acrylate copolymer.

7. The conductive composition of claim 6, wherein said alkyl moieties comprise at least one of ethyl, propyl, butyl, and hexyl.

8. The method of claim 1, wherein said anionic wetting agent is selected from the group consisting of alkali sulphosuccinate, alkali sulfosuccinate, and anionic polyacrylate copolymer.

9. The method of claim 1, wherein said anionic wetting agent is selected from the group consisting of dihexyl sulphosuccinate salt, di-2-ethylhexyl sulfosuccinate salt, and dioctyl sulfosuccinate salt.

10. The method of claim 1, wherein the conductive composition further comprises at least one solvent selected from the group consisting of alcohols, amines, glycols, acetates, ethers, ketones, aldehydes, and amides.

11. The method of claim 1, wherein said silver conductive particles are about 10 to 90% of said composition, said copolymer is about 2 to 50%, said defoamer is about 0.01 to 4%, and said anionic wetting agent is about 0.01 to 6% by weight.

12. The method of claim 11, wherein said silver conductive particles are about 40 to 75% of the composition, the copolymer is about 2 to 20%, the defoamer is about 0.1 to 2%, and the anionic wetting agent is about 0.1 to 3% by weight.

13. The method of claim 12, wherein said silver conductive particles are about 50 to 70% of the composition, the copolymer is about 4 to 10%, the defoamer is about 0.2 to 1.5%, and the anionic wetting agent is about 0.5 to 2% by weight.

14. The method of claim 10, wherein the longest dimension of said silver conductive particles is from about 100 nm to 50 micrometers, said styrene/(meth)acrylic copolymer is a copolymer of styrene and an alkyl (meth)acrylate, optionally partly hydrolyzed or salified; said anionic wetting agent is selected from the group consisting of alkali sulphosuccinate, alkali sulfosuccinate, and anionic polyacrylate copolymer; said copolymer to water has a ratio of 4:1 to 1:8; and said composition has a Zahn cup #3 viscosity in the range of about 10 to 40 seconds.

15. The method of claim 1, wherein said composition has a Zahn cup #3 viscosity in the range of about 10 to 40 seconds.

16. The method of claim 1, wherein said composition is applied by coating, spraying, painting, or printing.

17. The method of claim 1, wherein said composition is applied by screen, rotary screen, gravure, or letterpress printing.

18. The method of claim 1, wherein said composition is applied by flexographic printing.

19. The method of claim 18, wherein said composition is applied so as to realize graphics with less than about 500 micrometer spacing between adjacent lines.

20. The method of claim 18, wherein said composition is applied so as to realize graphics with less than about 300 micrometer spacing between adjacent lines.

21. The method of claim 1, wherein said composition is applied in an amount such that after drying the dried composition has a volume resistivity of about 120 micro-ohms.cm or lower.

22. The method of claim 21, wherein said composition is applied in an amount such that after drying the dried composition has a volume resistivity of about 60 micro-ohms.cm or lower.

23. The method of claim 1, wherein said composition is applied on said substrate in the form of an antenna.

24. The method of claim 1, wherein said composition is applied on said substrate in the form of an RFID antenna.

25. The method of claim 24, wherein said composition is applied on said substrate in the form of the RFID antenna designed to operate in the frequency range of at least 800 MHz.

26. The method of claim 25, wherein the RFID integrated circuit chip is applied to said RFID antenna via direct chip attachment, RFID strap attachment, or through space contact.

27. The method of claim 26, wherein said RFID integrated circuit chip is EPC Class 1 UHF RFID compliant.

28. The method of claim 1, wherein said composition is applied on said substrate to form a printed circuit.

29. The method of claim 1, wherein said substrate is a cellulosic substrate.

30. The method of claim 29, wherein said cellulosic substrate is selected from the group consisting of coated paper, uncoated paper, thermal transfer paper, direct thermal paper, coated cardboard, uncoated cardboard, a primed uncoated cardboard, kraft paper, fluted paper, and mottled paper.

31. The method of claim 1, wherein said substrate is a plastic.

32. The method of claim 30, wherein said substrate is selected from the group consisting of a polyester, polyethylene, polypropylene, polyamide, polyimide, polyetherimide, polyurethane, polycarbonate, cellulosic ester (e.g. cellulose acetate etc.), polystyrene and styrenic copolymers.

33. The method of claim 1, wherein said substrate is a metal-oxide coated plastic.

34. A method of forming a conductive pattern on a substrate comprising applying a conductive composition consisting essentially of (a) metallic silver conductive particles, (b) water soluble styrene/(meth)acrylic copolymer, (c) an anionic surfactant, (d) defoamer and (e) 10 to 80% water, the composition providing a sheet resistance of less than 0.83 ohms/sq, on the substrate and drying the composition.

35. The method of claim 34, wherein the longest dimension of said silver conductive particles is from about 100 nm to 50 micrometers, said styrene/(meth)acrylic copolymer is a copolymer of styrene and an alkyl (meth)acrylate, optionally partly hydrolyzed or salified; said anionic surfactant is selected from the group consisting of alkali sulphosuccinate, alkali sulfosuccinate, and anionic polyacrylate copolymer; said copolymer to water has a ratio of 4:1 to 1:8; said composition has a Zahn cup #3 viscosity in the range of about 10 to 40 seconds; and wherein said silver particles are about 50 to 70% of said composition, said copolymer is about 4 to 10%, said defoamer is about 0.2 to 1.5%, said anionic surfactant is about 0.5 to 2% by weight, said water is about 20 to 65%, and said composition provides the sheet resistance of less than 0.38 ohms/sq.

36. The method of claim 35, wherein said silver conductive particles are about 40 to 75% of the composition, said copolymer is about 2 to 20%, said defoamer is about 0.1 to 2%, said anionic surfactant is about 0.1 to 3% by weight, said water is about 25 to 35%, and said composition provides the sheet resistance of less than 0.18 ohms/sq.

37. A method of forming a conductive pattern on a substrate comprising applying a conductive composition consisting of (a) metallic conductive particles, (b) water soluble styrene/(meth)acrylic copolymer, (c) an anionic surfactant, (d) defoamer, (e) 10 to 80% water, and optionally another solvent, the composition providing a sheet resistance of less than 0.83 ohms/sq, on the substrate and drying the composition.

38. The method of claim 37, wherein said metallic conductive particles are silver and the longest dimension of said silver conductive particles is from about 100 nm to 50 micrometers, said styrene/(meth)acrylic copolymer is a copolymer of styrene and an alkyl (meth)acrylate, optionally partly hydrolyzed or salified; said anionic surfactant is selected from the group consisting of alkali sulphosuccinate, alkali sulfosuccinate, and anionic polyacrylate copolymer; said copolymer to water has a ratio of 4:1 to 1:8; said composition has a Zahn cup #3 viscosity in the range of about 10 to 40 seconds; and wherein the silver conductive particles is are about 50 to 70% of said composition, said copolymer is about 4 to 10%, said defoamer is about 0.2 to 1.5%, said anionic surfactant is about 0.5 to 2% by weight, said water is about 20 to 65%, and said composition provides the sheet resistance of less than 0.38 ohms/sq.

39. The method of claim 38, wherein said silver conductive particles are about 40 to 75% of the composition, said copolymer is about 2 to 20%, said defoamer is about 0.1 to 2%, said anionic surfactant is about 0.1 to 3% by weight, said water is about 25 to 35%, and the composition provides the sheet resistance of less than 0.18 ohms/sq.

* * * * *